United States Patent [19]
Hwang et al.

[11] Patent Number: 5,376,482
[45] Date of Patent: Dec. 27, 1994

[54] PHOTOMASK HAVING ALIGNMENT MARKS

[75] Inventors: Joon Hwang, Jincheonkun; Hyun G. Lee, Seongbukku; Hong L. Kim, Seongnamsi; Young B. Yi, Seochoku; Jae In, Suwonsi, all of Rep. of Korea

[73] Assignee: Hyundai Electronics Industries Co., Ltd., Kyoungkido, Rep. of Korea

[21] Appl. No.: 65,241

[22] Filed: May 20, 1993

[30] Foreign Application Priority Data

May 20, 1992 [KR] Rep. of Korea ............... 1992-8567

[51] Int. Cl.⁵ .............................................. G03F 9/00
[52] U.S. Cl. ...................................... 430/5; 355/53
[58] Field of Search ................... 430/5; 378/34, 35; 355/53, 77, 125

[56] References Cited

U.S. PATENT DOCUMENTS 5,250,983 10/1993 Yamamura .......................... 430/5

Primary Examiner—Steve Rosasco
Attorney, Agent, or Firm—Darby & Darby

[57] ABSTRACT

A photo mask for detecting misalignment of stepper blades and undesirable pattern array on an wafer comprises: a number of highest limit alignment marks 5 to 8 located in the outside of a field pattern area for forming product dies on the wafer and indicating the highest limits in setting positions of the stepper blades respectively and a number of lowest alignment marks 9,10 and 11 located respectively in three corners of the said outside of the field pattern area and indicating the lowest limits in setting positions of the stepper blades respectively, and forming a predetermined geometrical shape together.

2 Claims, 2 Drawing Sheets

PHOTOMASK HAVING ALIGNMENT MARKS

BACKGROUND OF THE INVENTION

1. Field of the Invention

The present invention relates to a photo mask having alignment marks and more particularly to a photomask having alignment marks for detecting undesirable location of stepper blades and undesirable mask pattern array on a wafer.

2. Description of the Prior Art

A conventional type of a photomask will be described, in referring to FIG.1.

FIG.1 shows an arrangement view of a photomask in company with stepper blades which consist of top stepper blade 3a, bottom stepper blade 3b, left stepper blade 3c, right stepper blade 3d.

Each stepper blade making a right angle moves left and right toward pattern area 1 and remains the necessary part, that is, pattern area 1, according to a shape of a photomask 12 and cuts off ultraviolet rays from the unnecessary part of photo mask.

However, when the stepper blades are inaccurately located because of input errors, a photo mask is more open or covered.

So, if a photo mask is more open, an unnecessary pattern and a unintended peripheral area of wafer is exposed and a product die of wafer is inferior if a photo mask is more covered, a necessary pair of pattern and wafer is not exposed and a product die of wafer is inferior Furthermore, the prior art have one or more collateral difficulties detecting misalignment of stepper blades and the array of product dies on the wafer when the first pattern is formed, Accordingly, the object of the present invention is to provide a photomask having alignment marks for detecting undesirable location of stepper blades and undesirable mask pattern array on a wafer.

SUMMARY OF THE INVENTION

A photomask having alignment marks for detecting misalignment of the stepper blades according to the present invention is defined by claims with a specific embodiment shown in the attached drawings. The invention relates to a photo mask for detecting misalignment of stepper blades and pattern array comprising: a number of first alignment marks located in the outside of a field pattern area for forming product dies on the wafer and indicating the highest limits in setting positions of the stepper blades receptively; and a number of second alignment marks located respectively in three corners of the said outside of the field pattern area and indicating the lowest limits in setting position of the stopper blades respectively, and forming a geometrical shape together.

BRIEF DESCRIPTION OF THE DRAWINGS

For understanding of the nature and objects of the invention, reference should be had to the following detailed description taken in conjunction with the accompanying drawings in which.

DETAILED DESCRIPTION OF THE INVENTION

Figure 1:
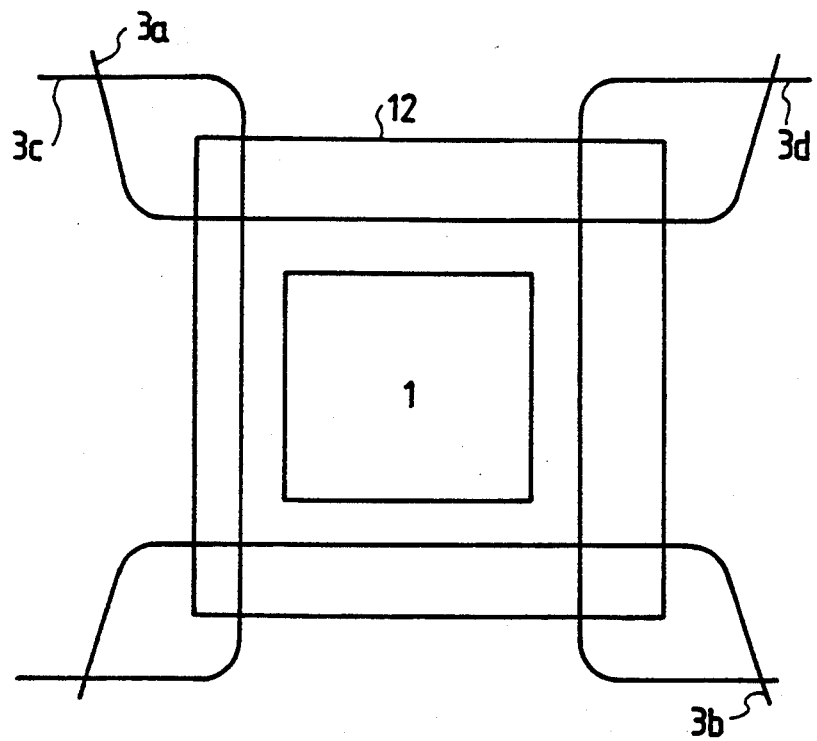
FIG.1 illustrates an arrangement view of a typical photomask in company with stepper blades of a prior art.
Figure 2A:
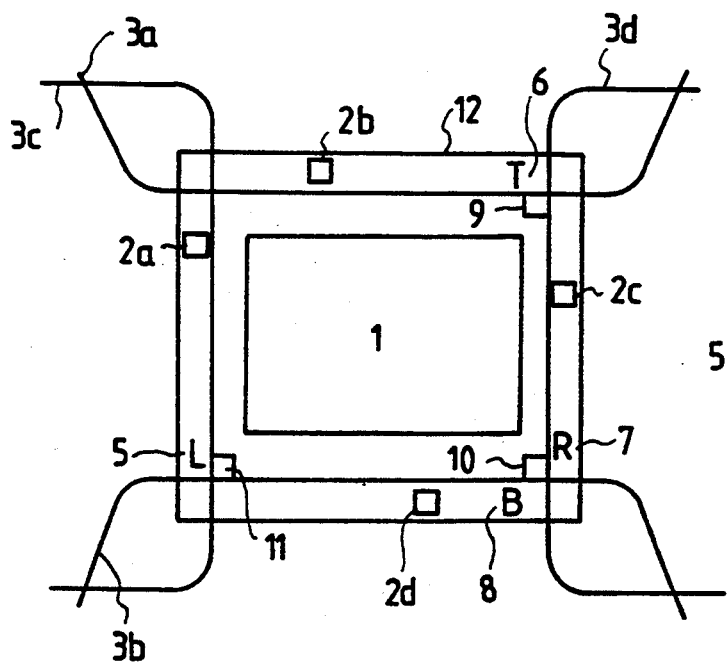
FIG.2 illustrates an arrangement view of a photomask having alignment marks in company with stepper blades according to an embodiment of the present invention.
Figure 2B:
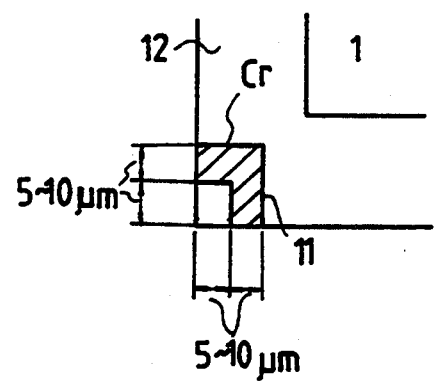

FIG. 2A to 2B illustrated the arrangement view of a photomask having alignment marks in company with stepper blades according to an embodiment of the present invention.

Referring to FIG.2A, a photomask 12 have reticles (2a through 2d) and the lowest limited alignment masks 5 to 8 and the highest limited alignment marks 9,10 and 11 for stepper blades 3a through 3d.

Left stepper blade 3c is located between the highest limited alignment mark 5 and the lowest limited alignment mask 11 and right stepper blade 3d is located between the highest limited alignment mark 7 and the lowest limited alignment mark 9 and 10.

Also, top stepper blade 3a is located between the highest limited alignment mark 6 and the lowest alignment mark 9 and bottom stepper blade 3b is located between the highest limited alignment mark 8 and the lowest limited alignment mark 10 and 11.

the highest limited alignment marks 5 to 8 is formed by a non chrome material on a photomask 12 in order to find direction. A distance between pattern area 1 and the lowest limited alignment mark is 5,000–20,000 $\mu$m.

A width of the lowest alignment mark line is 5–10 $\mu$m, and the lowest alignment marks are formed by a chrome material on a photo mask 12, as shown FIG.2B.

Figure 3:
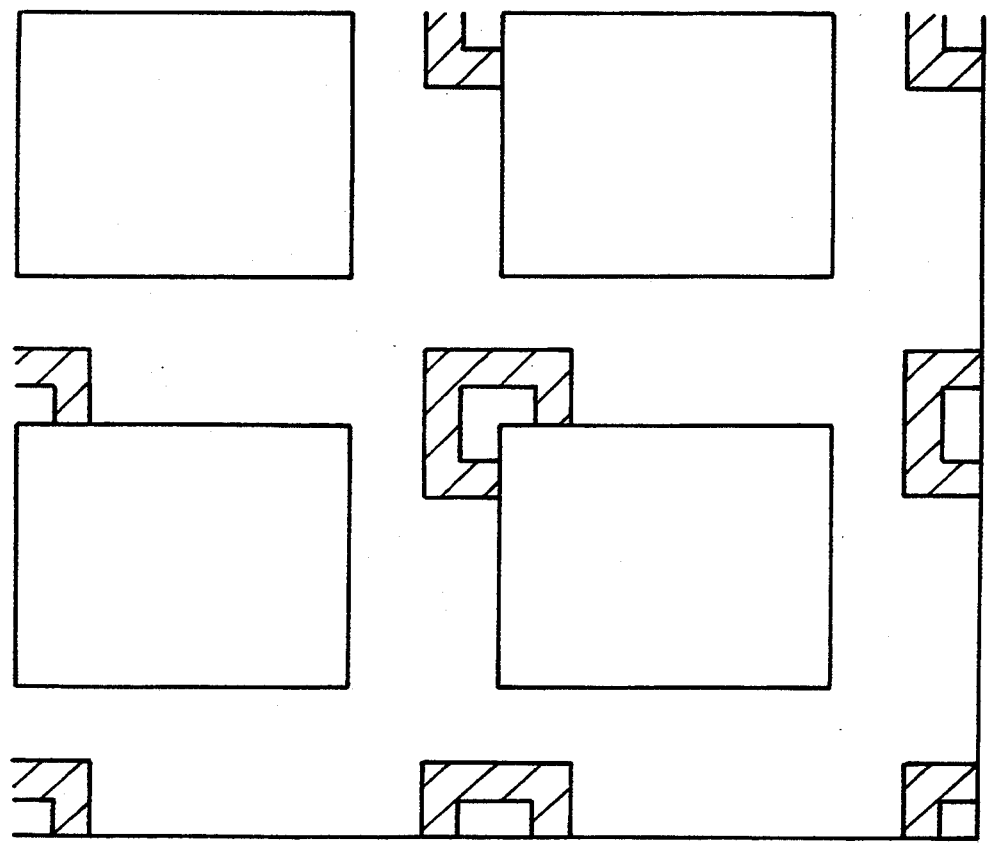
FIG.3 illustrates a wafers having a geometrical shape of developed lower limited alignment marks and product dies.

After a photomask is exposed, if the position of stepper blades is normal, a pattern of the lowest limited alignment mark must be formed and a pattern of the highest limited alignment mark must not be formed on a wafer FIG.3 shows a wafer having a geometrical shape of the lowest limited alignment marks and product dies, product dies and connecting shapes of the developed lowest limited alignment marks appear on a wafer when mask pattern is developed on a wafer, moving a wafer left and right, up and down, as shown in FIG. 3.

If the connecting shapes of the lowest limited alignment marks bring to distortion and cutting line, mask pattern array and the location of stepper blades are mistaken.

Also, the highest limited alignment marks 5 to 8 appear on a wafer in case that stepper blades is more open, as show in FIG.3. The photo mask according to the present invention has the following benefits in contrast with the prior art:

1) In case the first patterns are formed, a misalignment of pattern array is easily detected on a wafer in which the standard vernier is not formed.

2) the setting position of stepper blades is accurately located and found 3) the photomask pattern process can be simply accomplished and a mistake of photomask pattern process can be decreased.

4) the productivity of semiconductor chip is increased.

What is claimed is:

1. A photomask for detecting misalignment of stepper blades and an undesirable pattern array on a wafer, comprising:

a number of highest limit alignment marks located in the outside of a field pattern area and indicating the highest limits in setting positions of the stepper blades receptively; and a number of lowest limit alignment marks located respectively in three corners of the said outside of the field pattern area and indicating the lowest limits in setting positions of the stepper blades respectively, and forming a predetermined geometrical shape together.

2. A photomask according to claim 1, wherein the first alignment marks are formed in the shape of a letter in order to indicate top, bottom, left and right directions respectively.

* * * * *